US006690673B1

(12) United States Patent
Jarvis

(10) Patent No.: US 6,690,673 B1

(45) Date of Patent: Feb. 10, 2004

(54) METHOD AND APPARATUS FOR A BIOMETRIC TRANSPONDER BASED ACTIVITY MANAGEMENT SYSTEM

(76) Inventor: Jeffeerson J. Jarvis, 4211 Mayapple Ct., Norcross, GA (US) 30092

(*) Notice: Subject to any disclaimer, the term of this patent is extended or adjusted under 35 U.S.C. 154(b) by 0 days.

(21) Appl. No.: 09/378,421

(22) Filed: Aug. 20, 1999

Related U.S. Application Data

(60) Provisional application No. 60/136,295, filed on May 27, 1999.

(51) Int. Cl.[7] ............ H03K 17/80

(52) U.S. Cl. ............ 370/401; 340/5.61; 340/825.49; 340/573.1

(58) Field of Search ............ 370/401; 340/825.49, 340/10.1, 573.1, 5.61; 705/7, 8; 342/456, 42; 455/456

(56) References Cited

U.S. PATENT DOCUMENTS 3,896,266 A 7/1975 Waterbury
4,582,985 A 4/1986 Lofberg
5,006,983 A * 4/1991 Wayne et al. .......... 705/8
5,053,608 A 10/1991 Senanayake
5,153,584 A 10/1992 Engira
5,259,025 A 11/1993 Monroe et al.
5,319,363 A 6/1994 Welch
5,438,321 A 8/1995 Bernard
5,465,082 A 11/1995 Chaco
5,566,327 A 10/1996 Sehr
5,596,652 A 1/1997 Piatek
5,635,907 A 6/1997 Bernard
5,657,389 A 8/1997 Houvener
5,815,114 A * 9/1998 Speasl et al. .......... 342/357.06
5,987,421 A * 11/1999 Chuang .......... 705/7
6,091,956 A * 7/2000 Hollenberg .......... 455/456

* cited by examiner

*Primary Examiner*—Edwin C. Holloway, III

(74) *Attorney, Agent, or Firm*—Patent Focus, Inc.; Richard C. McComas

(57) ABSTRACT

The present invention provides a method and apparatus for a biometric transponder based activity management system in a defined area. The system has a central server connected to at least one display station in the defined area. The display station may contain a biometric transponder reader for reading and interpreting the biometric attributes of a patron encoded within or on the transponder. The display station further relays selected information about the patron to the central server for selected data processing. The patron in possession of the biometric transponder may request a selected activity or entry into a selected area of the defined area. The system authenticates the patron's identity from the transponder and may grant the selected activity or allow the patron access to the selected defined area.

14 Claims, 8 Drawing Sheets

METHOD AND APPARATUS FOR A BIOMETRIC TRANSPONDER BASED ACTIVITY MANAGEMENT SYSTEM

This application claims the benefit of U.S. Provisional Application No. 60/136,295 filed on May 27, 1999.

FIELD OF THE INVENTION

The invention relates, in general, to an activity management system. In particular the invention relates to an activity management system providing on-demand wireless communication to a specific patron population within a defined area. More particularly the invention relates to a patron(s) positioned anywhere within the defined area who desires entrance to a selected activity, communications with other authenticated patron, or communications with the authorized representatives of the defined area.

BACKGROUND OF THE INVENTION

In general, present day theme parks span the entire range of a business enterprise. A theme park may also be a theme attraction, such as a zoo, Mall ski resort, learning farm, or casino etc. Present day theme parks provide a variety of services and products to their patrons. These services and products may comprise entertainment, food, lodging, and various amusement activities for individuals or families. Some theme parks are quite modest in size and are limited in scope in the number services and products they offer to patrons who frequent the park. On the other end of the spectrum, theme parks such as Walt Disney Attractions, Anheiser Bush, Paramount, and others are quite large and offer numerous services and products to patrons who frequent the park.

It is estimated that the top 100 worldwide theme parks have 280 million visitors or patrons each year. Theme parks in the United States have experienced a 6.7% growth rate in 1995 over 1994. Capitol spending on new parks and attractions in North America is estimated at more than $5 billion for 1995. On the average, patrons of theme parks spend $67.00 on food, gifts, and entertainment in addition to the entrance fee.

The common thread connecting all theme parks together is their need to maximize their efficiency. Large and small theme parks, to stay competitive, choose to provide patrons with services and products to produce the maximum activity for a minimum cost while not sacrificing the quality or enjoyment of their patrons. These activities cover the full gamut of a patron's desires and wishes. Individual or family patrons enter the theme park with the expectation of being entertained, amused, and satisfied with foods and beverages.

Various methods have been employed to manage, count, or control a patron's desires and wishes. In general, all of the tried methods involve collecting information about a large group of patrons engaged in purchasing, participating in an amusement, and entering or leaving the theme park. The reason this information is based on large groups is that information about individual patrons is difficult to obtain and not readily available. One attempt to collect this type of information is collecting information at the point-of-sale of a particular item by a patron. This methodology does not lend itself to sales to each patron. The sale must be completed by the patron who is in control of the cash or credit card. The predominate groups of patrons at any given theme park are families. The point-of-sale of an item is a sale to the whole family. Obtaining individual information about the sale of the item is based on the person who pays for the item purchased not the intended person who actually desires or retains the item.

Attempts in the past, prior to the present invention, to rectify this problem included implementing a computer based information system. U.S. Pat. No. 5,566,327 issued to Sher on Oct. 16, 1996 is an example of a computer based information system that controls the point-of-sale transactions to patrons in the theme park. The Sher patent discloses a biometric identification card used in conjunction with point-of-sale locations in a theme park. The intended purpose of the Sehr invention is to control the theme park's operational cost of providing services and products to its patrons. The principle feature of the Sehr patent is a computer based information system that provides up-to-date information for micro marketing and inventory control by point-of-sale transactions in a theme park environment.

The biometric card disclosed in the Sher patent verifies the card itself is present for payment of services or products purchased by a patron. The Sehr biometric card can not authenticate the holder of the card. There is no information contained on the Sehr biometric card that identifies whether the user of the card is indeed the correct or authorized patron. There is no information disclosed in the Sehr patent that allows the information management system to determine the identity of the actual patron who made the buying decision. The Sehr biometric card is a verification system that only allows verification of the card and does not authenticate the user and the card at the same time. Authentication establishes the patron in possession of the biometric card to be the patron making the purchase of service or product.

The Sehr patent discloses a centralized computer based information system. The central computer verifies all transactions from the point-of-sale using the Sehr biometric card. This is a serial operation. When a patron makes a purchase, the point-of-sale is verified and recorded by the central computer. This type of operation is already employed in restaurants where point-of-sale purchase is transacted with an ordinary credit card. The patron of the restaurant presents his credit card in payment for the meal. The restaurant cashier scans or enters the credit card number into the appropriate machine, and both the patron and the cashier wait for the central computer to verify the credit card. This wait may seem to be instantaneous or it may be several minutes in duration.

The reason the transactions resulting from a restaurant point-of-sale require an extended period to verify is that people tend to eat food at the same time each day. People tend to arrive at the restaurant at the same time and leave at the same time. This causes havoc with the central computer system trying to control point-of sale transactions. The point-of-sale system of the Sehr patent discloses this very same phenomenon. People tend to arrive in large groups and at specific times at theme parks. Transactions at mealtime will also resemble the same bottleneck experienced in non theme park restaurants.

It would be desirable to have an activity management system that manages day-to-day activities of a theme park to include authentication of a patron's purchase of services or products and provides individual patron marketing information. The activity management system would be in communication with patrons through a portable interactive communication device. The communication device would be a contactless credit card with a secure radio frequency identification. The card would be capable of multiple functions and multiple security levels using a combination of magnetic stripes, two-dimensional bar codes, integrated circuit chips, optical storage or two-dimensional symbology, (an image of a character). The card would be capable of contactless authentication, not verification, as with the Sehr patent biometric card.

The desired information management system would be a wireless local area network providing on demand interactive communication to a specific patron population within a defined area, such as an amusement or theme park, mall, or convention center. A patron positioned anywhere within the network would selectively communicate with other patrons through strategically placed display stations or kiosks throughout the network area.

SUMMARY OF THE INVENTION

The amusement or theme park industry is well aware of the competitive nature of the business. The theme parks, to stay competitive, require data to maximize their efficiency and stay competitive. Until the present invention, only static data was available. The static data was derived from point of sale, marketing, and occasional patron(s) comments to theme park management. Interaction between the patron(s) and the theme park was limited to the span of time the patron(s) was within the confines of the theme park. This particular span of time was directed to the initial entry into the theme park, after which the theme park had no visibility as to the whereabouts of the patron(s) or the patron(s) activities.

The present invention provides dynamic or real time data through a computer controlled activity management system. The activity management system manages day-to-day activities of a theme park to include, in part, authentication of a patron's purchase of services or products and individual patron marketing information. The activity management system may, if desired, be in communication with patrons through a portable interactive communication device. The device is capable of multiple functions, multiple security levels, and of contactless authentication of the patron.

The activity management system, in general, is a wireless local area network providing on demand interactive communication to a specific patron population within a defined area. A patron positioned anywhere within the network may, if desired, selectively communicate with other patrons through strategically placed display stations or kiosks throughout the network area.

A first patron, in possession of the communication device, desires a particular activity selected from a plurality of activities present on the display station. The display station in communication with the activity management system authenticates the first patron and the first patron's identity by comparing patron identifiers encoded on or in the communication device to the first patron. If the first patron and the first patron's identifiers are the same, the patron is granted that desired activity. The activity management system may, if desired, process the data of this transaction along with the positional notation of the first patron to produce a real-time histogram of the patron's activity selection and position within the confines of the theme park.

A second patron, in possession of a second communication device, and being remotely disposed from the first patron may desire to communicate with the first patron. The second patron requests communications via a display station position anywhere within the confines of the theme park. The second patron presents to the display station his communication device containing a selected identifier. The identifier was previously encode onto the communications device by the theme park. The activity management system authenticates the second patron via the identifier (as discussed above). The activity management system authenticates the first patron via his own particular identifier thus assuring secured communications between the first and second patron.

The activity management system, in part, provides on-demand interactive communication to a specific patron population each having a communication device that contains a previously encoded identifier. The patron(s) may desire an activity requiring controlled access within the theme park. The patron(s) may also request delayed entrance to the activity thereby avoiding long lines of individuals seeking entrance into the same activity. The patron(s) selects a particular activity from a menu of activities displayed on a kiosk that is positioned adjacent to the particular activity. The activity management system authenticates the patron (as discussed above) and activates a virtual queuing management program. The virtual queuing management program positionally notes the patron's request for entrance into the activity. When the patron's position is advanced to a selected space relative to the entrance of the requested activity the virtual queuing management program notifies the patron via the communication device. The patron, in response to this notification, proceeds to a selected entrance for the activity and is granted instant entrance into the activity.

When taken in conjunction with the accompanying drawings and the appended claims, other features and advantages of the present invention become apparent upon reading the following detailed description of the embodiments of the invention.

BRIEF DESCRIPTION OF THE DRAWINGS

The invention is illustrated in the drawings in which like reference characters designate the same or similar parts throughout the figures of which.

DESCRIPTION OF THE PREFERRED EMBODIMENT

An Overview of the Present Invention

The preferred embodiment of the present invention is an activity management system for a theme park. The present invention is generally illustrated at 10, FIG. 1. The theme or amusement park 12 may, if desired, be any type of theme park that functions to provide products and services to individuals or families by providing various types of games, rides, food, or entertainment and recreational retail viewing/shopping activities. A typical example of a theme park is Six Flags Over Georgia, managed by Premier Parks, Oklahoma City. Other such theme attractions include Vail Ski Resort, Colorado; Madame Toussaud's Waxworks, UK; the Walters Haas Pavilion, California; the Rose Bowl, California; and Ceasar's Palace, Nevada.

Figure 1:
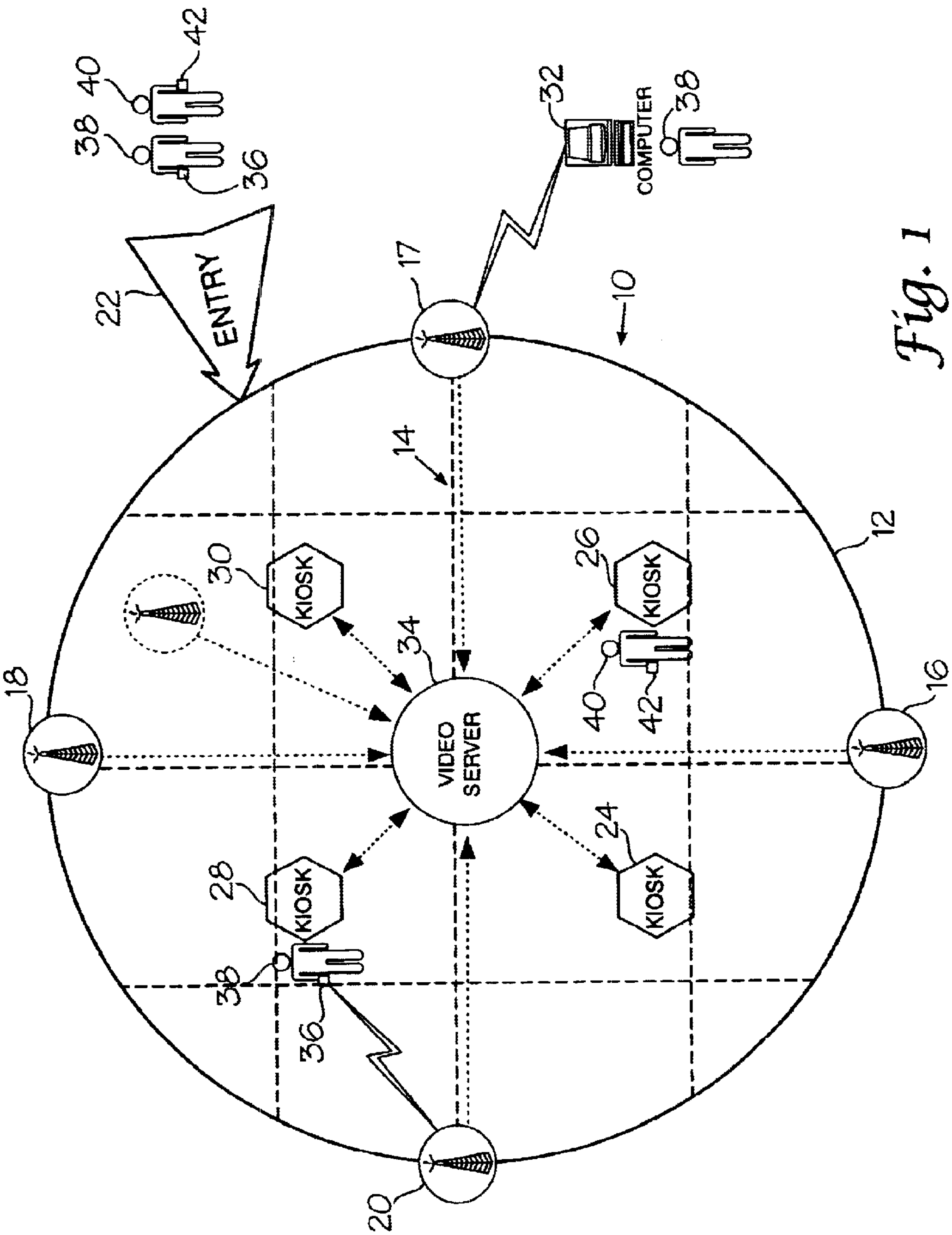
FIG. 1 illustrates a top level view of the preferred embodiment of the present invention.

The present invention 10 encircles and/or overlays the existing theme park 12. A communications system, generally illustrated at 14, is superimposed on the theme park 12. The communications system 14 enables communication between past, present, and future patrons of the theme park 12. The communications system 14 also provides interactive communications between the aforementioned patrons and the theme park management, theme park employees, or designated associates of the theme park 12. The communications may, if desired, be conducted via any suitable medium that allows communications between individuals, family members, or theme park designees. Typical examples of this communications medium are the WorldWide Web (Internet), telephone, mail, or kiosks strategically positioned throughout the theme park 12. The positioning of the kiosks 24, 26, 28, and 30, FIG. 1, are only intended for illustrative purposes. The kiosks 24, 26, 28, and 30 may, if desired, be positioned about the theme park 12 in any convenient arrangement or quantity that allows communications system 14 to operate whether in direct connection (hardware), cable or wireless mode.

A central video server 34 provides the intelligence via a plurality of stored software programs that command and control the operative features of the present invention 10. The operative features of the present invention 10 interact with individual patrons, family members, or theme park designees. The video server 34 is also in communication with various activities or events distributed or positioned throughout the park 12. The various activities or events may, if desired, be concession stands, amusement rides, or any other form of facility that enables the aforementioned patrons to engage and/or interact in the theme park 12.

The general operation of the present invention 10 (discussed in detail herein) may, if desired, begin with an individual patron 38 communicating with the theme park 12 via his computer 32, receiving antenna 17 (or land line if applicable), to video server 34. The individual 38 requests entry or enrollment into the theme park 12 on a specified date in the future. Enrollment may also be done in off-line mode through electronic connection with a slave or distributed processor which, through on-demand or scheduled prompts, would connect to and communicate all required data to a central server/processor. The video server 34 records the request and sends a confirmation to the individual patron 38.

The patron 38 receives the confirmation and at the selected time and date arrives at theme park 12's entrance 22. The patron 38 has decided to include in his visit to the theme park 12 another individual 40. The individual 40 is not pre-enrolled with the present invention 10. The individual 40, if desired, may enroll as a temporary patron and become temporary patron 40. The enrollment of patrons 38 and 40 via the Internet or at theme park 12's entrance 22 entitles each patron to, among other things, a biometric transponder 36 (discussed in detail herein). If patrons 38 and 40 desire, they may both receive a biometric transponder.

Each biometric transponder presented to a patron has encoded or stored therein financial, biographical, demographic, and/or physical attributes of the selected patron. The biometric transponder 36, in concert with a biometric card reader, authenticates patron 38 or 40 by interpreting the stored data on or in the biometric transponder 36. The interpretation of the stored data on or in the biometric transponder 36 is an actual comparison of the data to an actual attribute of the patron when the patron wishes to engage in an activity, event, and/or purchase within the theme park 12. For example, patron 38 desires access to a selected event within the theme park 12 and engages the biometric transponder 36 with a selected physical attribute that pertains only to patron 38. The patron 38 presents the biometric transponder 36 and the physical attribute to the biometric card reader. The biometric card reader authenticates the selected attribute with the stored attribute information and decides if patron 38 is authorized access to the desired event. The very same process is implemented with biometric transponder 42 and temporary patron 40. Patron 40 may be a park participant for one or even for many visits, although in the latter case, the visits would occur infrequently if at all. Patron 40 is essentially differentiated from a permanently enrolled patron by the specific enrollment procedures followed and by their results, restricted access to certain high visibility services such as a queue management. Patron services of this sort would be widely publicized as explicitly reserved for a special class of patrons such as ticket holders, etc.

Another operational feature of the present invention 10 is the interactive communication between patrons. For example, both patrons 38 and 40 have respective biometric transponders 36 and 42 associated with their person. Patron 38, either by desire, plan, or mistake, has become separated from patron 40. Patron 38 desires to communicate with patron 40. Patron 38 approaches any given kiosk and requests to communicate with patron 40. In this example patron 38 has approached kiosk 28 and made his request. The video server 34 is in communications with kiosk 28 via the communications system 14. The video server 34 has also positionally noted the presence of the patrons 38 and 40 in their respective journeys throughout the theme park 12. The video server 34 has also authenticated patron 38 as discussed above. The kiosk 28, in concert with the video server 34, authenticates the presence of patron 40 at kiosk 26 (made available to patron 40). The patrons 38 and 40 may now communicate with each other. The authentication of patrons 38 and 40 insures both patrons involved that they are communicating with the intended party.

A More Detail Discussion of the Present Invention

The Theme Park

Figure 2:
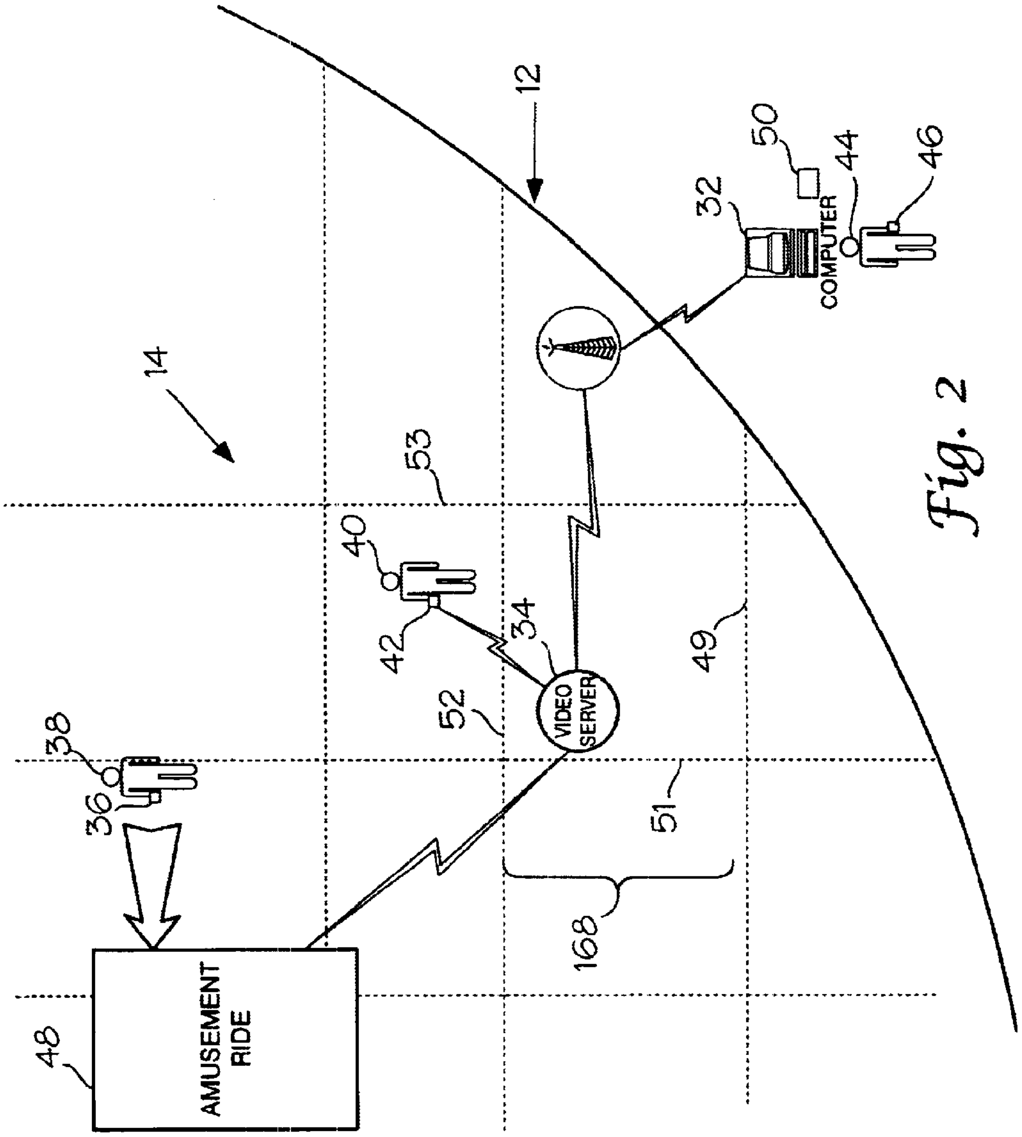
FIG. 2 illustrates a top level view of the queuing management system of FIG. 1.

The theme park 12, FIG. 2, may, if desired be any suitable encircled, enclosed, or defined area upon which a communications system is overlaid. The defined area may, if desired, be any geometric shape or combination of shapes. The defined area of the theme park 12 may, if desired, overlap or be spaced from a second area that is also a definable area with its own communications system. The theme parks may, if desired, be physically spaced apart by any given distance but their respective communications systems may overlap. The present invention 10 enables multiple communications systems to freely, interactively, and bi-directionally communicate with each other.

The Communications System

The communications system 14, FIG. 2, links together patrons and the theme park 12. Any communications system may be used that allows timely or real time, interactive, bi-directional communication between the theme park 12, patrons, and any designated or selected third party. An example of a typical communications system is manufactured by Motorola or AXCESS, Inc. The patrons inside the defined area of the theme park 12 may, if desired, communicate with other patrons via the communications system 14 in concert with kiosks located about the park. The communications system 14 also links the patrons and the theme park 12 to a third party. The third party may, if desired, be designated by the theme park 12 and/or by the patrons who are either actively visiting the theme park 12 or who have visited the theme park 12 in the past. An example of a third party communicating with the theme park 12 is a mail order distributor, FIG. 2. The mail order distributor 44 has access to the computer 32, which may be the same, or a different computer used by patron 38. The computer 32 is positioned outside of the defined area of the theme park 12. The computer 32 may, if desired, be operationally attached to a biometric transponder reader 50, such as the AXCESS Inc. FFT Reader NT132 RDF (a serial gateway reader with a LONWORKS protocol interface for networking multiple readers). The biometric transponder reader 50, once activated, authenticates (as discussed herein) the mail order distributor 44 by his biometric transponder 46. Once authentication is complete, the mail order distributor 44 may communicate with the theme park 12. The mail order distributor 44 may communicate with the theme park 12 via the World Wide Web, modem, or any other suitable communications link provided by telephone or communication companies such as BellSOUTH or AT&T. The mail order distributor 44 may now request information about a particular demographic group of patrons. The mail order distributor 44 may also request information about a selected demographic individual from a group of past or present patrons of the theme park 12. The mail order distributor 44 may also communicate directly with any patron inside the theme park 12. The computer 32 and biometric transponder reader 50 are not limited to third party use. They may also be used by individual patrons who wish to communicate with the theme park 12.

The communications system 14 overlays the theme park 12 and, in part, comprises a plurality of receiving antennas 16, 17, 18, and 20, FIG. 1. The receiving antennas may, if desired, be of any quantity to provide suitable coverage for the communications system 14. The receiving antennas 16, 17, 18, and 20 in concert with the video server 34 provide an adjustable communications and tracking grid. The adjustable grid of the present invention 10 may, if desired, form any geometric shape that allows effective operation of the communications system 14. The grid lines 49, 51, 52, and 53, FIG. 2, represent only four grid lines that form quadrant 168. The quadrant 168 may, if desired, be symmetrical from any given point within the theme park 12. The placing of the adjustable grid that overlays the theme park 12 is controllable by the video server 34. If desired, the grid may be expanded to cover a large area of the theme park 12 or contracted to focus on any particular area within the theme park 12. A typical example of a communications system that is well known in the art to incorporate an adjustable grid is manufactured by NOKIA, Ericsson, or Symbol Technologies.

The Biometric Transponder

The biometric transponder implemented in the present invention 10 may, if desired, incorporate one or more features that allows the biometric transponder to authenticate the patron with the encoded information contained in or on the transponder. Any size or complexity of biometric transponder that is convenient or compatible for the patron to use may be implemented.

Figure 3:
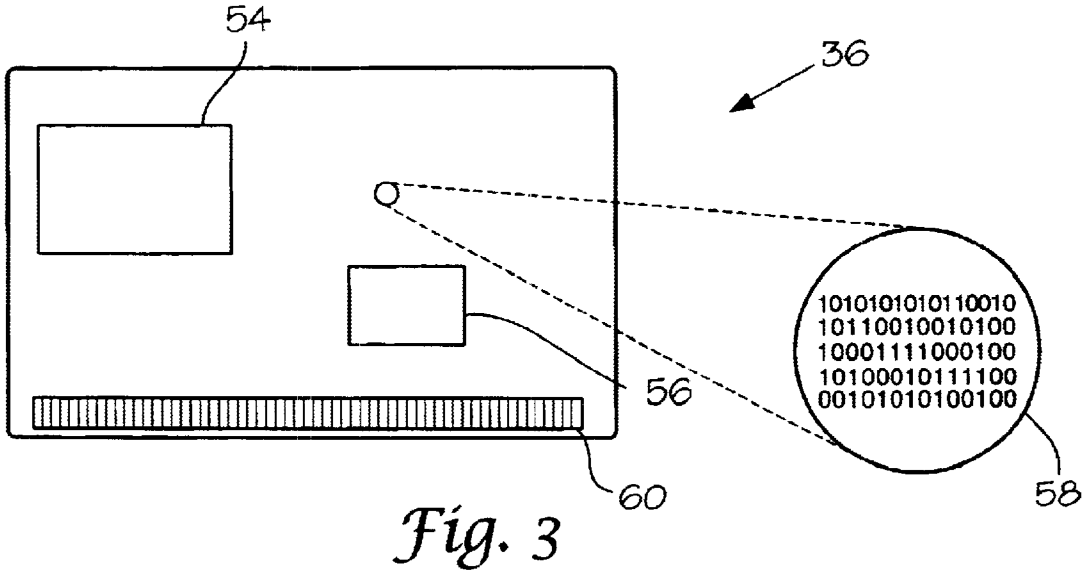
FIG. 3 illustrates a schematic view of the biometric transponder of FIG. 2.
Figure 4:
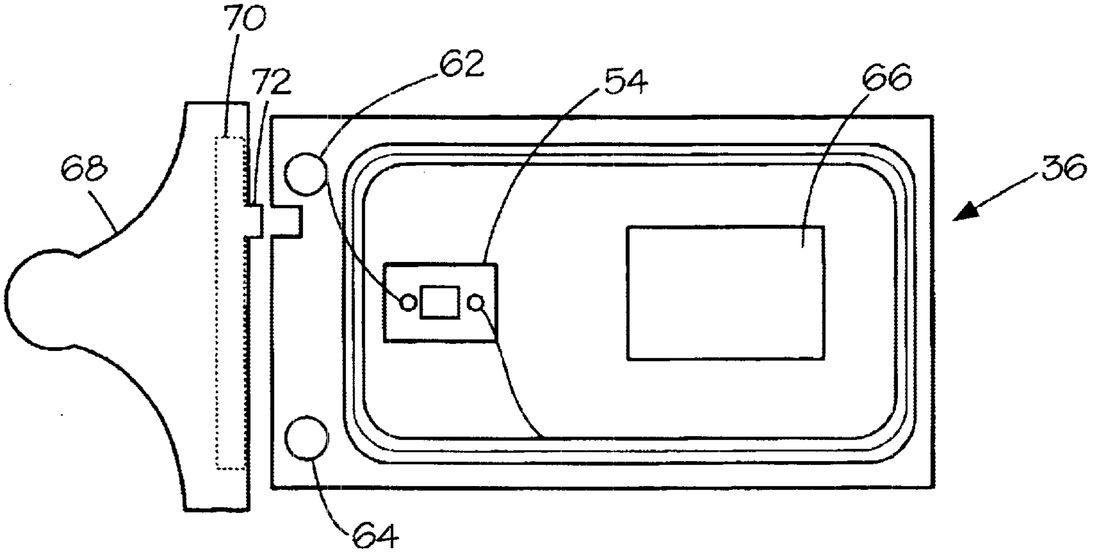
FIG. 4 illustrates a schematic of an alternate biometric transponder of FIG. 2.

A typical biometric transponder 36, FIG. 3, manufactured by AXCESS, Inc. is worn by the patron 38, FIG. 2. The biometric transponder 36, FIG. 3, may, if desired, contain a radio frequency (RF) detector 54 that allows the communications system 14 via the video server 34 to positionally note or track the biometric transponder 36 throughout the theme park 12. The biometric transponder 36 may also contain an integrated circuit with memory 56 that has stored within pertinent data concerning a particular patron. A magnetic strip or bar code 60 may be added to enhance the convenience and interaction between the patron holding the biometric transponder 36 and the present invention 10. One or both surfaces of the biometric transponder 36 may, if desired, be encoded with a plurality of two dimensional (2D) symbology. An example of the 2D symbology that may identify a given attribute of a patron is illustrated at 58. The 2D symbology may, if desired, be a series of ones and zeros or any other characters that allow encoding of pertinent information concerning the patron. The electrical power necessary for the integrated circuit 56 to function is obtained from a battery 66, FIG. 4.

The battery 66 may, if desired, be screen-printed onto one surface of the biometric transponder 36. An alternate battery 70 may be operationally connected or embedded into a clip 68. The clip 68 provides replacement electrical power to the biometric transponder 36 without disturbing or altering the contents of any encoded or pertinent data stored on the biometric transponder 36. The clip 68 mates with the biometric transponder 36 and detachably engages contact points 62 and 64. If desired, a polarizing notch 72 may be added to insure unidirectional insertion of the battery 70 to the mating contacts 62 and 64.

The Activity Management System

Figure 5:
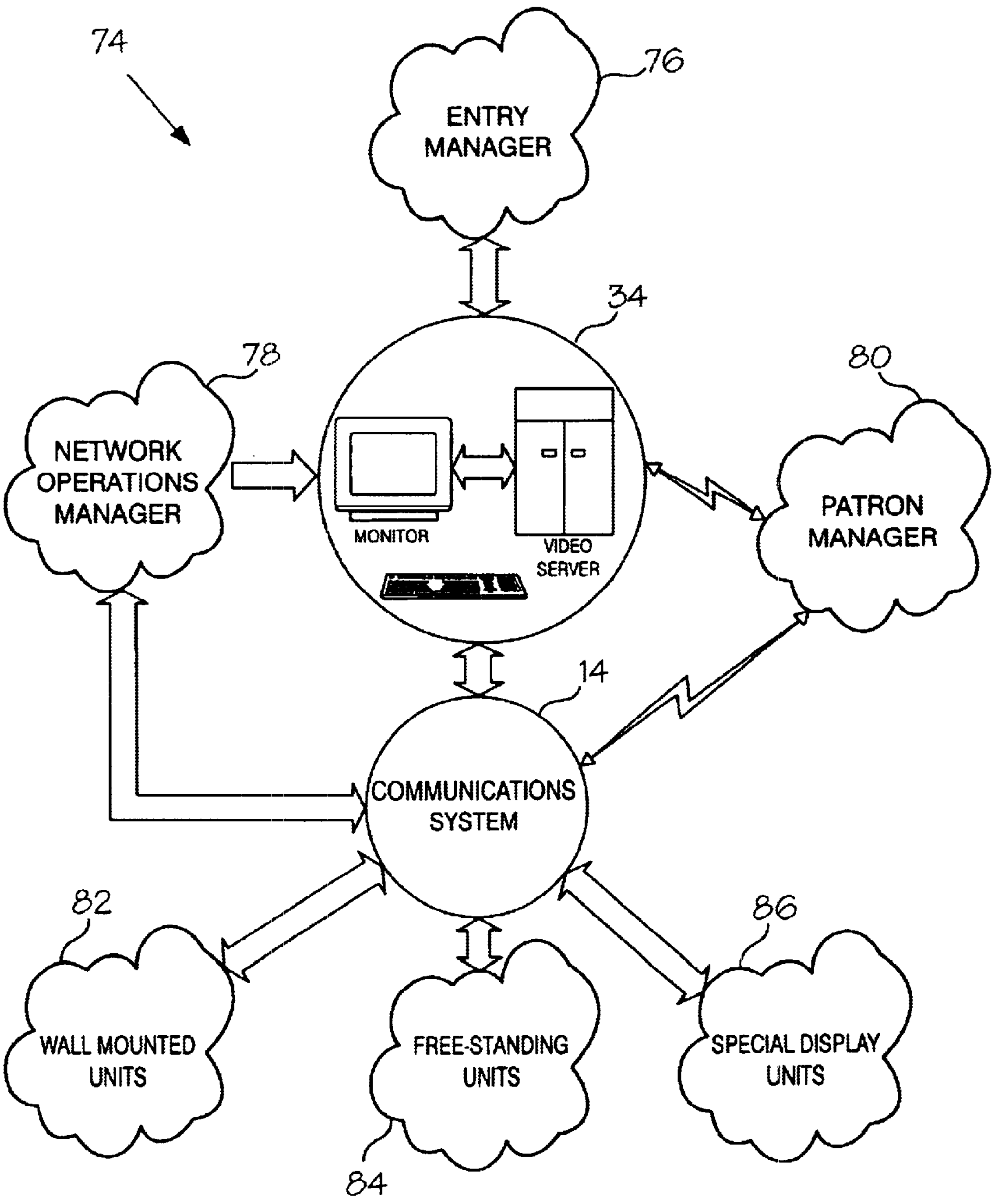
FIG. 5 illustrates a top level view of an activity management system.

The activity management system of the present invention 10 is generally illustrated at 74, FIG. 5. The management system 74 is a plurality of software programs written or stored in the memory of the video server 34. The management system 74 comprises, in part, a network operations manager 78, a patron manger 80, and an entry manger 76. The management system interactively communicates, via the communications system 14, with a plurality of user interface devices. Any number or type of communication devices may be connected, via communications system 14, to the management system 74 that allows either unidirectional or bidirectional communications with patrons. Patrons are defined as people who desire entry to the theme park 12, anyone who desires to communicate with a patron already present within the theme park 12, or other third party designee. Examples of the user interface devices are wall mounted units 82, freestanding units 84, and special display units 86. Third party designees are defined to be selected commercial endeavors that desire to communicate with patrons, such as mail order distributors e.g. Land's End catalog, J. Crew clothing catalog, etc., and vendors such as Toys-R-Us, MacDonalds, Pepsi Cola, etc.

The Entry Manager

Figure 6:
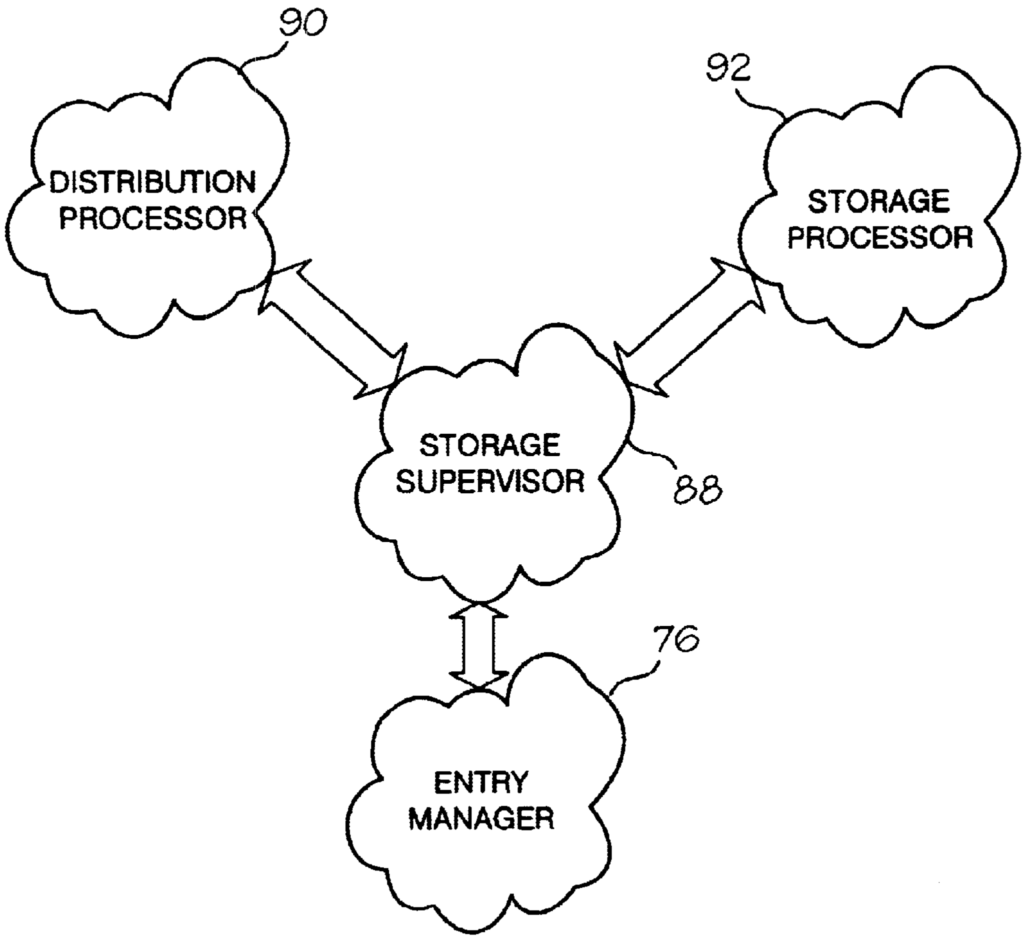
FIG. 6 illustrates a top level view of the entry manager of FIG. 5, FIG. 7. illustrates a more detailed view of the entry manager of FIG. 6.

The entry manager 76, FIG. 6, commands and controls the entry of patrons into theme park 12. The entry manager 76 comprises, in part, a storage supervisor that parallel processes storage requests from the entry manager and the distribution processor. The distribution processor is the chief localized repository of software data files, including: patron names, eligibility criteria, authorization codes, network control programs, etc.

Figure 7:
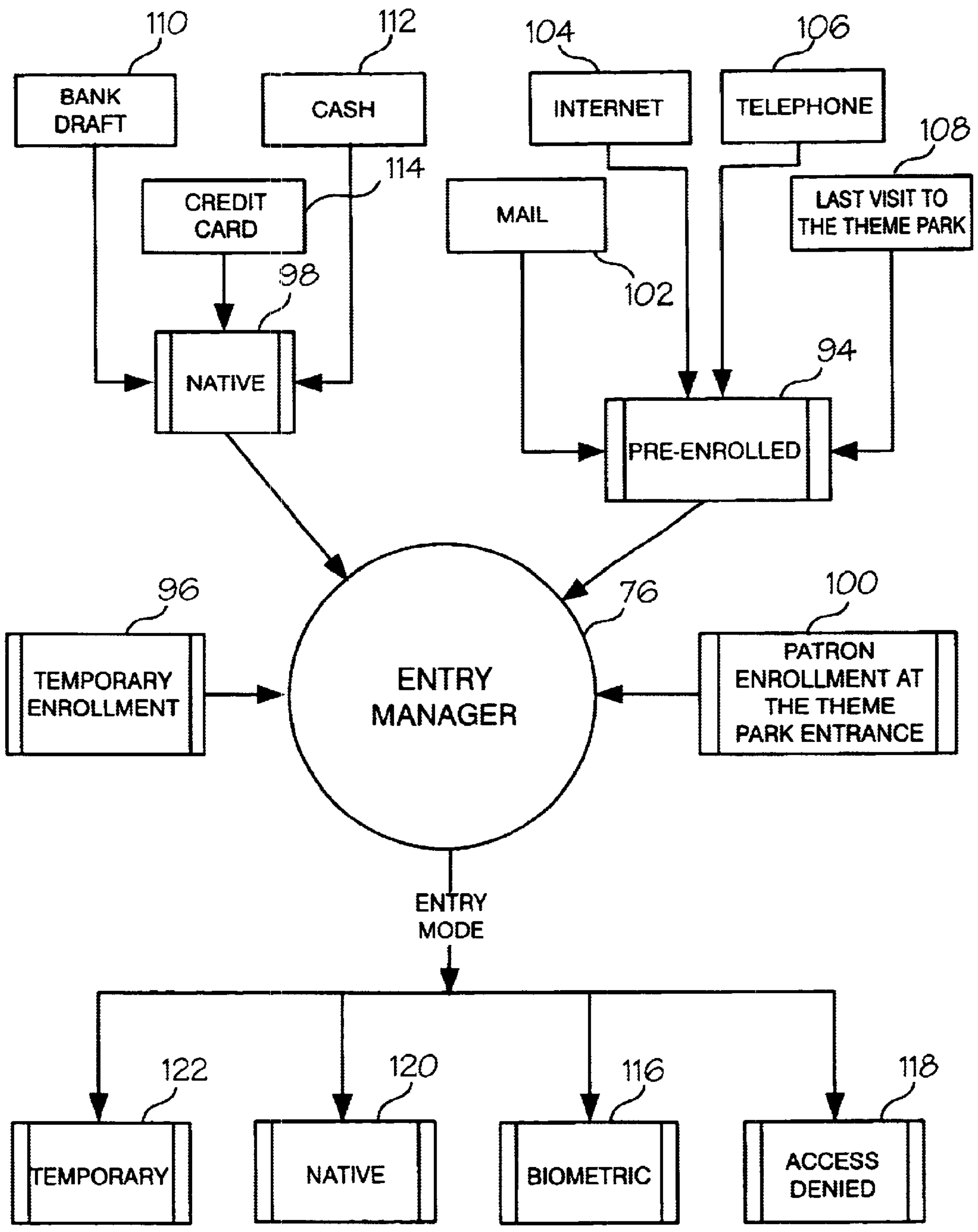

The entry manager 76, FIG. 7, receives information or data from patrons who desire entry into theme park 12. Entry into theme park 12 may be accomplished by a plurality of methods. Any one of the methods may be used either singularly or in combination with other methods. In the preferred embodiment, only four methods will be discussed. Other entry methods may, if desired, be used that are well known in the art.

A patron may be pre-enrolled 94, temporary 96, native 98, or enrolled at the entrance 100 to the theme park 12. The pre-enrollment 94 may, if desired, be by mail 102, Internet 104, telephone 106, or during the patron's last visit to the theme park 12. The pre-enrollment entitles the patron to direct entry into the theme park 12 to engage in activities, entertainment and/or purchases controlled by the activity management system 74.

If desired, a patron may choose not to participate in the features offered by the present invention 10. This patron will still be granted access to the theme park 12 but he will enter in the native mode 98. The access will be granted after the patron pays an entrance fee by credit card 114, bank draft 110, or cash 112.

A patron may, if desired, temporarily enroll 96 at the theme park 12. Temporary enrollment 96 is conditionally granted to the patron if he is accompanied by an enrolled patron. The temporarily enrolled patron 96 does not desire to participate in all of the features offered by the activity management system 74 but still wishes to communicate with the enrolled patron via the various communications devices positioned about the theme park 12. Some features not granted to a temporally enrolled patron would include certain ride restrictions, retail purchase limits at one or more park venues, or pass restrictions on ride access or advance reservations (where installed).

A patron may, if desired, enroll at the entrance 100 to the theme park 12. Enrollment at the entrance 100 grants the patron all the rights and privileges of a pre-enrolled patron. The pre-enrolled patron 94 has direct access to the theme park 12 whereas the patron who enrolls at the entrance 100 may experience some delay in entering the theme park 12 due to a queuing entrance line.

Figure 8:
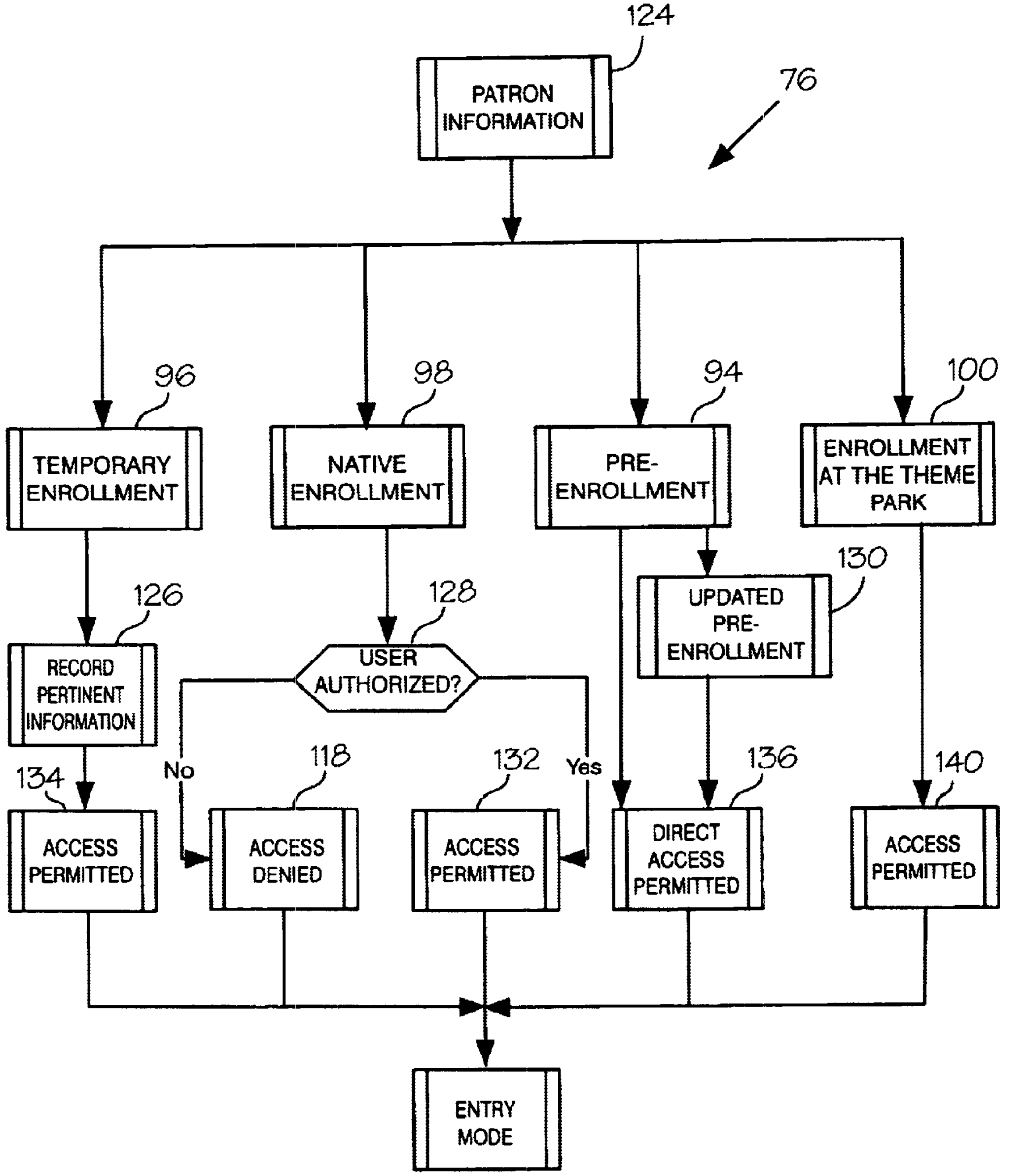
FIG. 8 illustrates a flow diagram of the entry manager of FIG. 7, FIG. 9. Illustrates a flow diagram of the patron manager of FIG. 5.

The entry manager 76 determines access to the theme park 12. The entry manager 76, depending on enrollment conditions and/or information received at the entrance to the theme park 12, may grant entrance in the biometric mode 116, the temporary biometric mode 122, the native mode, or deny access. The entry manager 76, FIG. 8 accepts the patron information 124 and determines if the expected patron is pre-enrolled, temporary, native, or requested entry at the entrance to the theme park 12. The information may, if desired, take the form of data received via the telephone, Internet, mail, or any other patron convenient method. The information received may also be the patron's name, address, telephone number, and/or credit card number. If the patron wishes temporary enrollment into the theme park 12, the entry manager 76 records the patron's pertinent information 126 and issues a biometric transponder to that patron. The patron is now permitted access 134 to the theme park 12. If the patron wishes to enter the theme park 12 in the native mode 98, the entry manager determines if the patron is authorized 128 to enter the theme park 12. If permission is granted the patron may enter in the native made (as discussed above). Patrons who are pre-enrolled 94 receive the most favored status at the theme park 12 because the entry manager 76 has a biometric transponder ready for their use while they are present at the theme park 12. When the patron arrives at the entrance to the theme park 12, the pre-enrollment information is updated 130 and the patron is permitted direct access to the theme park 12.

The Patron Manager

Figure 9:
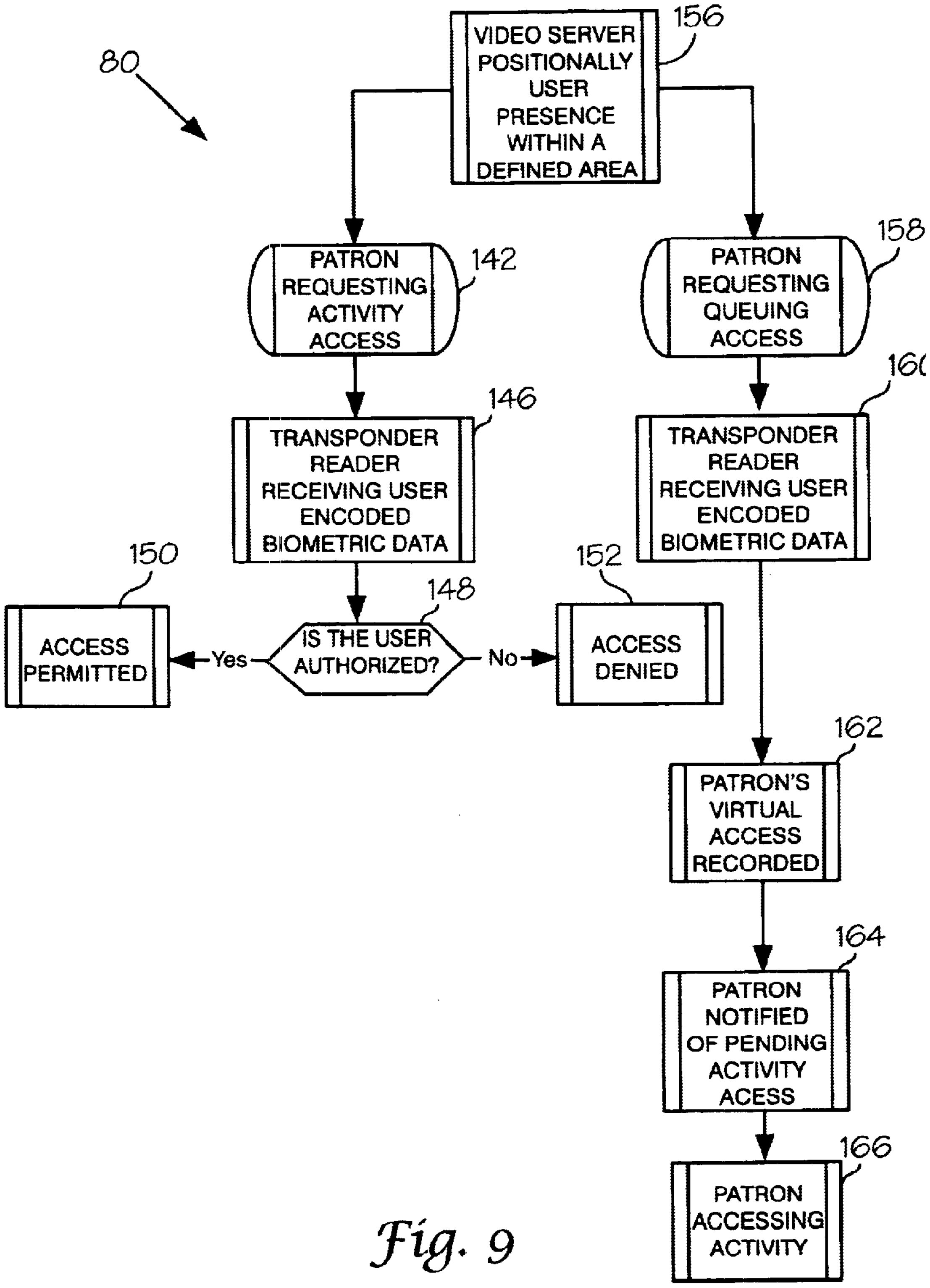

The patron manager 80, FIG. 9, commands and controls the interactivity between the theme park 12 and the patron. The patron manager 80 may, if desired, be electronically written or stored in the memory of the video server 34. Selected portions of the software program that comprise the patron manager 80 (objects) may, if desired, be written or stored in the memory of any one of the biometric transponder readers. The selected objects allow a given biometric transponder reader to authenticate a patron without circulating this authentication to the video server 34 and then back to the biometric transponder reader. This localized authentication of the patron reduces the overall time required to authenticate any given patron. The authentication of the patron is a real time event conducted by the biometric transponder reader. The biometric transponder reader may, if desired, transmits authentication data back to the patron manager 80 stored on the video server 34 using well-known batch processing techniques.

Each patron may, if desired, be in possession of a biometric transponder. The biometric transponder may be attached to the patron's wrist 36, FIG. 2, or to any other portion of the patron's clothing or anatomy, that allows interaction with the patron manager 80, FIG. 9. The patron manager 80 in concert with the communications system 14 and the video server 34 positionally notes the presence 156 of each patron within the confines of the theme park 12. The patron manager begins tracking the patron with a biometric transponder at the entrance 22 to the theme park 12. The tracking continues throughout the patron's stay within the confines of the theme park 12. The patron may request an activity access 142 such as communication with a second patron via the kiosk 28, FIG. 1. The biometric transponder reader receives the patron's encoded biometric data 146 from the patron and the patron manager 80 determines if the patron is authorized for this activity 148. If the patron is authorized 150 the patron manager 80 will find the requested second patron and notify that patron of an expected message. The first and second patrons do not have to be present or in queue to send or receive messages. Patrons have a mailbox assigned to them when entering the theme park 12. If the patron manager 80 determines activity access is not authorized, the patron is notified 152.

The activity access is not limited to communications between respective patrons. The activity access may, if desired, be between the patron and the request to purchase an item of interest while visiting the theme park 12. An example of an item of interest is beverage or food from a concession stand. Another example of activity access is a patron who is also a parent of a child who is temporally lost within the theme park 12. The patron manager 80 authenticates the patron and the data stored on the patron's biometric transponder are the same (as discussed above). The patron manager 80 locates the missing child via the communications system 14 and the video server 34. The patron may now retrieve the child with the aid of the patron manger 80 and the associated kiosks positioned about the theme park 12.

A patron may, if desired, request queuing access 158 at a selected activity. This activity may be an amusement ride where the patron has encountered a long line of other patrons who also desire participation in the selected amusement. The patron enters his biometric transponder into a transponder reader 160 and the patron manager 80 authenticates the requesting patron. The patron's virtual access to the selected amusement 162 is recorded. This record reflects the time, date, activity, patron's name, or any other suitable data to guarantee the patron's virtual access to the selected amusement. After the virtual access is recorded, the patron may move about the theme park 12 without concern as to his place in the queue. When the patron's turn in the queue is approaching, the patron manager 80 notifies the patron of pending access 164 to the selected amusement. The patron, receiving the notification, proceeds to the selected amusement entrance 166 and is granted direct access without reentering the queue. The patron requesting queuing access is not limited to an amusement ride. The request for queuing access may be activated wherever the authorized patron encounters a line or queuing arrangement within the theme park 12.

The Network Operations Manager

The network operations manger 78 commands and controls the flow of communication and data between the communications system 14 and the video server 34. The network operations manager 78 responds to commands from the patron manager 80 to command the communications system 14 to locate a particular patron by adjusting the overlying theme park communications grid. The patron manager 80 queries each network kiosk, wall-mounted display screen, and network controller whose RFID sensors form a pre-arranged, electronic "grid" wherein the fields overlay the park's physical (indoor and outdoor) boundaries. The patron manager 80 requests a real-time location report using the target patron's unique, permanent identification number. When one or more sensors report they have received the tag's signal, a vectoring algorithm is employed that fixes the tag's location relative to those sensor's receiving and reporting the tag's signal. A location value is then assigned to the system and displayed back to the inquiring patron. Copies of the transaction are also filed in permanent system memory and with authorized park security personnel. The individual making the location request sees an electronic display marking the requester's whereabouts and the location of the lost tag. A printout of the screen display is available to the patron. The patron may then go to the target site to identify and contact the subject of the patron's inquiry.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims, means-plus-function clause is intended to cover the structures described herein as performing the recited function and not only structural equivalents but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

I claim:

1. A biometric transponder based activity management system providing communication, command, and control to a patron population each having a biometric transponder operatively disposed thereto, comprising:

a) a server operationally disposed to a first communication display station, said server having stored thereon an activity management program;

b) a communications grid overlaying said first communication display station;

c) said activity management program in communications with said first communication display station via said communications grid;

d) a plurality of activities operationally disposed on said first communication display station, said first communication display station receiving an activity selection from a first patron;

f) said first communication display stations having a first program operatively disposed therein, said first program receiving biometric data from a first biometric transponder and identity data from the first patron, said first program authenticates the first biometric transponder's biometric data and said first identity data from the first patron;

g) said first program deriving authorization for said selected activity via the first biometric transponder's biometric data and identity data received from the first patron;

h) said first program communicating to said first communication display station authorization for said selected activity;

i) said first program communicating to said activity management program said authorized selected activity for processing.

2. A biometric transponder based activity management system as recited in claim 1 further comprising:

h) a second communication display station remotely spaced and in communication with said server;

i) a biometric identifier operatively disposed to a second biometric transponder, said biometric identifier receiving at least one definitive characteristic from a second patron;

j) said second communication display station having stored therein a second program said second program receiving said definitive characteristic from the second biometric transponder and identity data from the second patron, said second program authenticates the second biometric transponder's definitive characteristic and said identity data received from the second patron;

k) said second program receiving a request for communication with said first communication display station from the second patron, responsive to said request said second program verifies authorized communication between said first and said second communication display stations via said activity management program; and l) said activity management program responsive to said authorized request connects said first and said second communication display stations.

3. A biometric transponder based activity management system as recited in claim 2, wherein said definitive characteristics being derived from physical attributes of the first patron.

4. A biometric transponder based activity management system as recited in claim 3, wherein said communications grid being overlaid the first patron.

5. A biometric transponder based activity management system as recited in claim 4, wherein said communications grid being overlaid the first patron and the second patron.

6. A biometric transponder based activity management system as recited in claim 5 wherein said definitive characteristic is a physical attribute of the second patron.

7. A biometric transponder based activity management system as recited in claim 6, wherein said definitive characteristic being selected from a group consisting of thumb, finger, hand, retina, thermal imprint, optical, aural, magnetic, electrical flux, radio wave remote detection system, systems to analyze facial features, and systems to analyze physical features.

8. A biometric transponder based activity management system as recited in claim 7, wherein said server being operatively disposed within said communications grid.

9. A biometric transponder based activity management system as recited in claim 8, wherein said first and said second communication display stations being positioned in a selected quadrant of said communications grid.

10. A biometric transponder based activity management system as recited in claim 9, wherein said first program authenticates the biometric transponder and the first patron by comparing secure symbology disposed on the first biometric transponder to said received definitive characteristics identifying from the first patron.

11. A biometric transponder based activity management system as recited in claim 10, wherein said server maintaining positional contact with the first and the second biometric transponders.

12. A biometric transponder based activity management system as recited in claim 11, wherein said communications grid being adjustable to facilitate positional contact and communications with the first and the second biometric transponders.

13. A biometric transponder based activity management system for a wireless local area network in a defined area, the system providing on-demand interactive communication to a specific patron population each having the biometric transponder operatively disposed thereto, comprising:

a) an activity requiring controlled access disposed within the defined area;

b) means for communicating from a server to a display station operationally disposed adjacent to said activity;

c) a virtual queuing management program operatively disposed within said display station, said queuing system receiving a request for delayed entry into said activity, said queuing program positionally noting said delayed request for entry into said activity;

d) means for authenticating the biometric data from the biometric transponder and identity data from the patron are the same; and e) said queuing system notifying the patron via the biometric transponder that entry into said activity is available.

14. A method for biometric transponder based activity management in a defined area, comprising the steps of:

a) providing a central server operationally connected to at least one display station in the defined area, a biometric transponder reader operationally disposed adjacent to said display station;

b) determining pertinent data corresponding to the identity and at least one physical characteristic derived from a patron;

c) encoding said pertinent data into a biometric transponder;

d) presenting said biometric transponder to said biometric transponder reader;

e) requesting entry into the defined area via said biometric transponder reader;

f) identifying said pertinent data identity and physical characteristic by said biometric transponder reader;

g) allowing access to the defined area subsequent to approval from said biometric transponder reader;

h) communicating said identification to said central server via said display station subsequent to allowing access to the defined area; and i) recording said allowed access activity on said central server.

* * * * *